United States Patent [19]

Deavenport et al.

[11] 4,211,959

[45] Jul. 8, 1980

[54] TOUCH-CONTROL ADAPTER FOR ELECTRIC LAMPS

[75] Inventors: Joe E. Deavenport, San Diego; John W. Roorda, El Cajon, both of Calif.

[73] Assignee: Westek Corporation, San Diego, Calif.

[21] Appl. No.: 939,363

[22] Filed: Sep. 5, 1978

[51] Int. Cl.² ............................................. G05F 1/00
[52] U.S. Cl. .................................. 315/362; 307/308; 200/DIG. 1
[58] Field of Search ................. 315/DIG. 4, 291, 362; 200/DIG. 1, DIG. 2; 307/116, 308; 340/562; 361/181

[56] References Cited

U.S. PATENT DOCUMENTS

| | | | |
|---|---|---|---|
| 3,784,848 | 1/1974 | Hamilton | 307/308 |
| 4,101,805 | 7/1978 | Stone | 307/308 |

*Primary Examiner*—David K. Moore

*Attorney, Agent, or Firm*—Brown & Martin

[57] ABSTRACT

Disclosed is a touch control adapter that is used with any standard electric lamp. It operates to turn the lamp on or off in response to a mere touching of the lamp. One embodiment operates as a three-way controller; while another embodiment operates as a dimmer controller. The control adapter includes a male electrical receptacle of the screw-in type for screwing the adapter into the light bulb socket of the lamp. Also included is a female electrical receptacle of the screw-in type for receiving the light bulb. Metal contacts extend from the adapter and touch the exterior of the light bulb socket of the lamp. This in turn is in electrical contact with other exterior parts of the lamp. Electronic circuitry within the adapter senses when a person is touching these exterior parts and passes predetermined portions of power received from the male receptacle to the female receptacle in response thereto.

9 Claims, 8 Drawing Figures

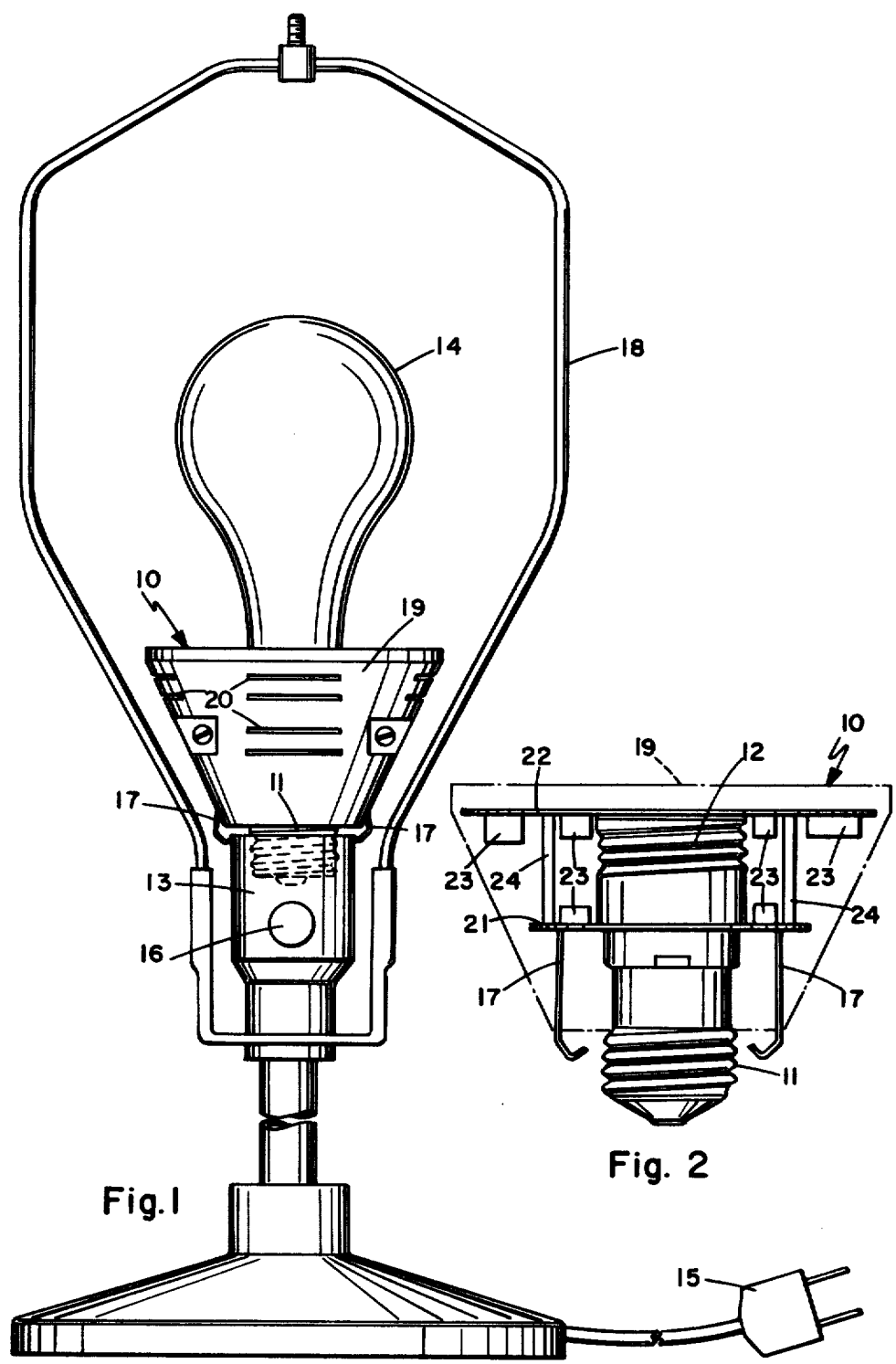

TOUCH-CONTROL ADAPTER FOR ELECTRIC LAMPS

BACKGROUND OF THE INVENTION

This invention relates to electric lamps, and more particularly to means for controlling the amount of light emitted from the lamp. Clearly, the conventional way of controlling the amount of light that the lamp emits is by means of a mechanical switch. Two-way switches have been used for over one hundred years. And four-way switches that provide three levels of brightness have also been used for many years. Accordingly, it is desirable to provide a new means for controlling the brightness of light emitted from a lamp. Such a means would be attractive at least as a novelty item.

It is particularly attractive to provide an adapter which controls the brightness of light emitted from existing lamps by a mere touching of the lamp. This would be both a novelty item and a practical item that makes control of the lamp easier. Other known attempts to accomplish touch-control of lamps however, have been carried by constructing a special purpose lamp. These lamps are specially shaped to provide room for packaging all the necessary electronic inside of the lamp. There are of course, considerable undesirable aspects to this approach. For example, the lamps themselves are restricted in shape. Further, no means is provided whereby an existing lamp can be modified to operate under touch control. Due to these and other limitations, prior art touch controlled lamps have not received wide acceptance by the public even as a novelty item.

The known prior art special purpose touch control lamps were also deficient in that their touch control circuitry was sensitive to the surroundings in which the lamp was used. If for example, the lamp was placed on a table near a large object, such as a large plant, the touch sensing circuitry would not always operate properly. Sometimes it could not distinguish between a person touching the lamp, and the presence of the large nearby object. And if the touch detecting circuitry were made less sensitive so that it would not be affected by the presence of large nearby objects, then a problem sometimes occurred wherein the sensing circuitry would not respond to slight touchings of the lamp. What is needed to solve this "sensitivity" problem, is an automatic sensitivity adjusting circuit which adjusts the sensitivity of the touch-control circuits in the lamp to be compatible with the surroundings.

Still another problem with prior art touch controlled lamps is that they must be plugged into the electric outlet in a particular manner in order to operate. That is, the 120 volts must be applied to one particular prong of the lamp plug. If the 120 volts is applied to the opposite prong, the touch sensing circuit will not operate. Typically, these lamps have labels on their cord with instructions saying that if the lamp does not work when first plugged in, then remove the plug from the wall socket and reinsert it in an opposite fashion. This is an inconvenience and thus it is desirable to provide a means for controlling the brightness of the lamp by touch regardless of how the lamp is plugged into an electric outlet.

Still another deficiency in known prior art touch control lamps is that they do not operate as a dimmer. In other words, they do not operate such that by merely touching the lamp the brightness of light emitted therefrom increases in a ramping manner until full brightness is reached. Instead, all of the known prior art touch control lamps simulate either a two-way or a four-way switch.

Therefore, it is one object of the invention to provide a control module adapter to be used with any standard electric lamp for controlling by touch the brightness of the light emitted therefrom.

Another object of the invention is to provide a control module adapter which includes automatic sensitivity circuitry for adjusting the touch sensitivity of the adapter to the nearby surroundings.

Still another object of the invention is to provide a control module adapter for controlling by touch the brightness of light emitted from a lamp regardless of which prong of the lamp plug had a 120 volts applied thereto.

Yet another object of the invention is to provide a touch operated dimmer control module for any standard electric lamp.

SUMMARY OF THE INVENTION

These and other objects are accomplished in accordance with the invention by a control module adapter which includes a male electrical receptacle of the screw-in-type for screwing the module into a light bulb socket of any standard electric lamp. Means for mounting electrical circuitry are fixedly connected to the male electrical receptacle. Included on this mounting means is a capacitive device, and a circuit for charging the capacitive device at spaced apart time intervals. Coupled to the capacitive device are metallic contacts which touch the exterior of the light bulb socket of the lamp whenever the module is screwed into the socket. Thus all conductive surfaces of the lamp that are in electrical contact with the exterior of the socket add to the capacitance of the capacitive device. These capacitances are discharged by a circuit which discharges them at a first rate when no person is touching a conductive surface, and at a second rate when a person is touching a conductive surface. A control circuit detects the first and second discharge rates and generates logic control signals in response thereto which indicates whether or not a conductive surface is being touched. A female electrical receptacle of the screw-in type for receiving a single filament light bulb and a switching circuit is also connected to the mounting means. This switching circuit passes predetermined portions of power received from the male electrical receptacle to the female electrical receptacle in response to the logic control signals.

One embodiment of the invention operates as a three-way light controller; while another embodiment operates as a dimmer. In the three-way embodiment, three successive touchings of the lamp will cause it to reach full brightness. In the dimmer embodiment, the brightness increases at a constant rate while the lamp is being touched. Both of these embodiments include an automatic sensitivity adjust circuit. This circuit ensures that the module operates properly under a wide range of capacitive loading conditions. Thus, the module operates correctly for lamps of all sizes and lamps with a variety of metallic exterior portions.

BRIEF DESCRIPTION OF THE DRAWING

Various preferred embodiments of the invention will best be understood by referring to the following drawings while reading the detailed description wherein;

FIG. 1 is a pictorial view of the disclosed control module adapter in an operating environment.

FIG. 2 is a side view of the control module adapter with its cover removed.

DETAILED DESCRIPTION

Figure 3:
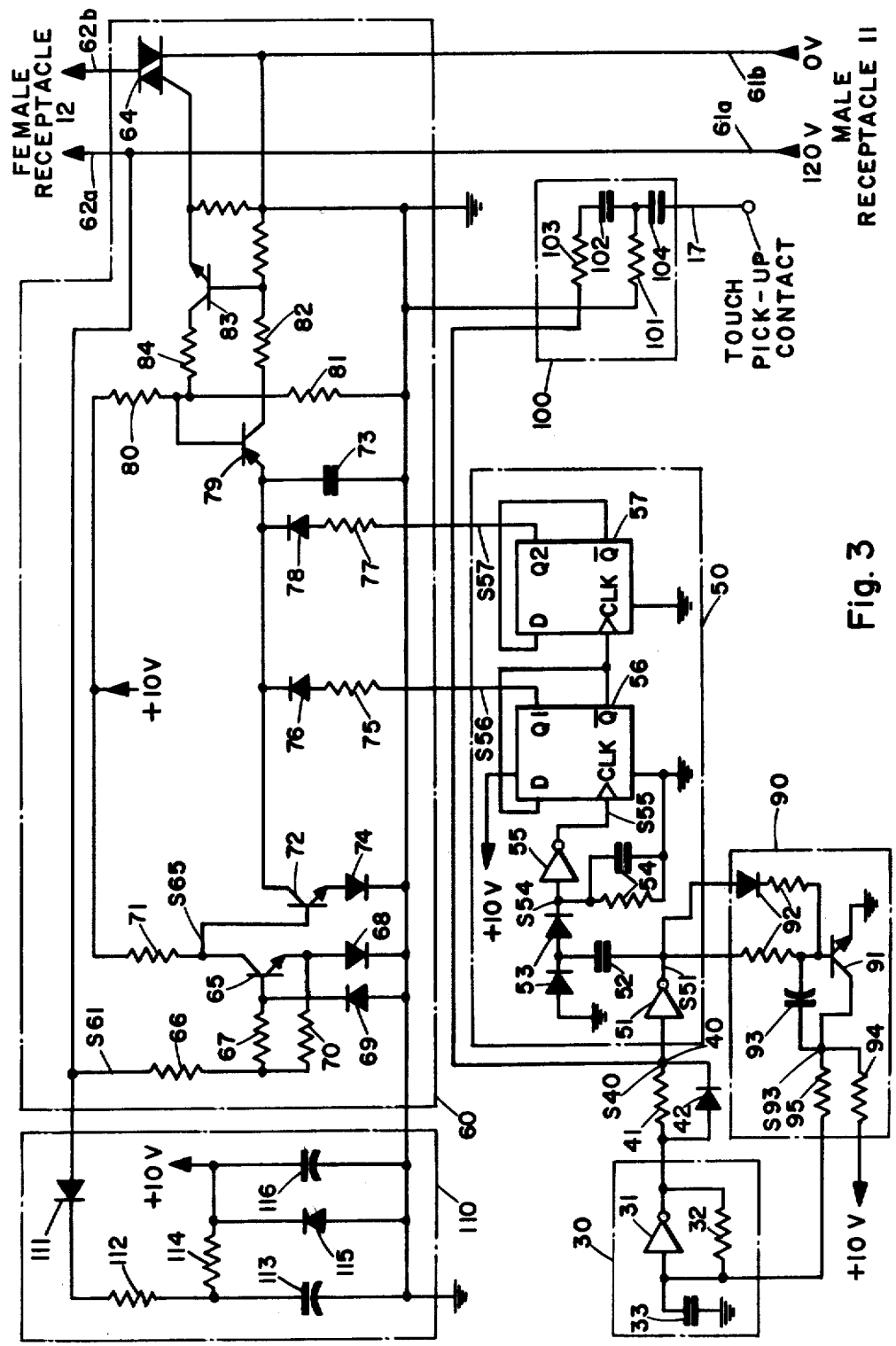
FIG. 3 is a detailed circuit diagram of the electronics within one preferred embodiment of the invention.

Referring now to FIG. 1, a control module adapter 10 in its operating environment will be described. Two of the basic components of adapter 10 are a male electrical receptacle 11, and a female electrical receptacle 12. Male receptacle 11 is of the screw-in type for screwing module 10 into the light bulb socket 13 of any standard lamp. Similarly, female receptacle 12 is of the screw-in type for receiving any standard single filament light bulb 14.

In operation, module 10 is screwed into socket 13 as illustrated. The module has a conical shape to allow it to fit within all standard harps. Then the lamp is plugged in via a standard plug 15 and turned on via a standard switch 16. With switch 16 turned on, power is applied to module 10 which in turn operates to control the brightness of light emitted from the single filament light bulb 14 by touch.

To this end, module 10 includes electrical contacts 17 for touching a metallic exterior portion of the lamp. In the illustrated embodiment of FIG. 1, contacts 17 touch the outside of socket 13. This socket is in electrical contact with other exterior conductive surfaces such as harp 18 for example. In order to turn the lamp on, these surfaces are merely touches by hand. This touching increases the capacitive loading on contact 17; and this increased capacitance is sensed by electronics within module 10. These electronics will be described in detail in conjunction with FIGS. 3 and 8. A plastic cover 19 is provided for enclosing these electronics in the finished module. Air holes 20 are provided in cover 19 so that air may circulate therein to cool the electronics.

In response to the sensing of a hand touching of the exterior conductive surfaces, the electronics within case 19 transfers predetermined portions of power received from male receptacle 11 to female receptacle 12. For example, one embodiment of the invention operates as a three-way controller for the lamp. One-third of the power received at receptacle 11 is transferred to light bulb 14 in response to a first touching of the lamp; two-thirds of the power is transferred in response to a second touching of the lamp; and substantially all of the power is transferred in response to a third touching of the lamp. A fourth touching of the lamp results in a turning off of the light bulb. This embodiment will be described in detail in conjunction with FIG. 3.

Another embodiment of the invention operates as a dimmer controller for the lamp. While the lamp is being touched, the electronics within case 19 operates to increase, at a predetermined rate, the power which is passed from receptacle 11 to receptacle 12. A time interval of approximately 3 seconds is required to go from zero power to full power. After full power is reached, a subsequent touching of the lamp is required in order to turn the lamp off. This embodiment of the invention is described in detail in conjunction with FIG. 8.

Next, referring to FIG. 2, there is illustrated a view of module 10 with cover 19 removed. Reference numerals 11, 12 and 17 indicate various portions of module 10 which were previously described. In addition however, module 10 includes a pair of circuit boards 21 and 22. These circuit boards provides a means for mounting the electronics inside the module. Various portions of these electronics are indicated in FIG. 2 via the reference numeral 23. Circuit boards 21 is circular in shape and has a diameter of about 2 inches. Circuit board 22 is also circular in shape; but it has a hollow center portion which receptacle 12 fits through. The inside diameter and outside diameters of circuit board 22 respectively are approximately one inch and three inches. Electrical contact is made between circuit boards 21 and 22 via leads 24 which also act as spacers for the two boards.

A detailed circuit diagram of one embodiment of the invention will now be described in conjunction with FIG. 3. Electrical waveforms which occur at various key points in this embodiment are illustrated in FIG. 4. This embodiment includes an oscillator that is shown generally at 30, and which produces an output signal S30. Oscillator 30 is comprised of an inverter 31 with hysteresis, a feedback resistor 32 and a capacitor 33. These components are interconnected as illustrated. Resistor 32 may be 47 K; and a capacitor 33 may be 100 picofarads as an example.

Signal S30 is coupled to a capacitive node 40 through a resistor 41 and a diode 42. Diode 42 is connected in parallel across resistor 41. Thus, the impedance from oscillator 30 to node 40 is relatively small when the output of oscillator 30 is high; whereas the impedance from node 40 back into oscillator 30 is relatively large. Due to the low input impedance, oscillator 30 operates to charge node 40 almost instantaneously. In comparison, due to the large output impedance of node 40, that node discharges at a relatively slow rate. This discharge rate is proportional to the capacitance of the node. Signal S40 in FIG. 4 represents the voltage waveform at node 40.

Node 40 is electrically connected to the previously described contacts 17. They in turn are in contact with the exterior of lamp socket 13; and the socket is electrically connected to other conductive surfaces of the lamp. Harp 18 is one such conductive surface. In operation, node 40 discharges at a first rate when someone is touching the conductive surface; and it discharges at a second rate, which is substantially less then the first rate, when nobody is touching a conductive surface. This can be seen in FIG. 4. At time instance T1, T2, and T3, nobody is touching the lamp, and thus node 40 discharges at a relatively fast rate. Conversely, at time instance T4, T5, T6, and T7, the capacitance at node 40 increases due to someone touching the lamp. Consequently, during these time instances, node 40 discharges at a relatively slow rate.

Node 40 connects to a control circuit 50 which operates to detect the first and second discharge rates. It also generates logic signals indicating the various rates. Control circuit 50 includes an inverter gate 51 having an input connected to node 40. Preferably, inverter 51 has hysteresis. This is illustrated in FIG. 4 by the dashed lines 52 and 53. Line 52 represents the level at which the input voltage to circuit 51 must drop below in order to cause the output of circuit 51 to switch high. Similarly, line 53 indicates the level above which the input to circuit 51 must be in order for circuit 51 to switch low. Signal S51 in FIG. 4 represents the output of circuit 51.

As can be seen from FIG. 4, signal S51 consists of a sequence of pulses whenever the capacitance at node 40 is relatively small. This is because a small capacitance at node 40 enables the voltage at that node to discharge past level 52, and the output of circuit 51 switches when its input drops below this level.

Conversely, the output of circuit 51 is a constant low when the capacitance of node 40 is relatively high. This is because a high capacitance at node 40 causes the node to discharge at a relatively slow rate. And due to this slow rate, the voltage at the input of circuit 51 does not fall below the hysteresis level 52. Thus, during time instants T4, T5, T6, and T7 signal S51 is a constant low level.

Signal S51 is coupled through a capacitor 52 and diodes 53 to a resistor capacitor circuit 54. A signal S54 is developed across circuits 54 as illustrated in FIG. 4. Basically, signal S54 consists of a relatively high level whenever signal S51 is pulsing; and consists of a relatively low level whenever signal S51 is a constant low. This is because the pulses of signal S51 pass through diode 53 and charge resistor capacitor circuit 54. However, when signal S51 is not pulsing, the resistor capacitor circuit 54 discharges to a low level.

Signal S54 is coupled to an inverter gate 55. Inverter 55 also operates with hysteresis as previously described. Therefore, when signal S54 is at a relatively high level, the output of inverter 55 is a constant low. Conversely, when capacitor 54 discharges past level 52, inverter 55 switches to a high level. Signal S55 in FIG. 4 represents the output of inverter 55. Time instance T8 illustrates the above described sequence.

Signal S55 couples to the clocking input of a D flip-flop 56. Also, the $\overline{Q}$ output of flip-flop 56 couples to the clocking input of another D flip-flop 57. Flip-flops 56 and 57 both have their $\overline{Q}$ output connected to their D input. Therefore, they both operate as toggle flip-flops. In other words, the Q and $\overline{Q}$ outputs of flip-flops 56 and 57 change state in response to a low to high transition on their respective clocking inputs. Signal S56 in FIG. 4 represents the Q output of flip-flop 56, and a signal S57 represents the Q output of flip-flop 57. In the illustrated waveforms both of these signal change state in response to the transition of signal S55 at time instant T8.

Signals S56 and S57 represents control signals which are used to switch predetermined portion of power received from the previously described male electrical receptacle 11 to female electrical receptacle 12. A circuit for switching this power is indicated via reference numerals 60. Two of the inputs to circuit 60 are signals S56 and S57. In addition, circuit 60 received power from a pair of input leads 61a and 61b. These leads are a portion of receptacle 11. Similarly, circuit 60 includes a pair of leads 62a and 62b for passing power to light bulb 14. These leads are a portion of receptacle 12.

Various portions of power are passed from leads 61a and 61b to leads 621 and 62b by TRIAC 64. That TRIAC 64 makes an electrical connection between leads 61b and 62b in response to the control signals S56 and S57; and the TRIAC turns off when the current through it goes to zero.

Figure 5:
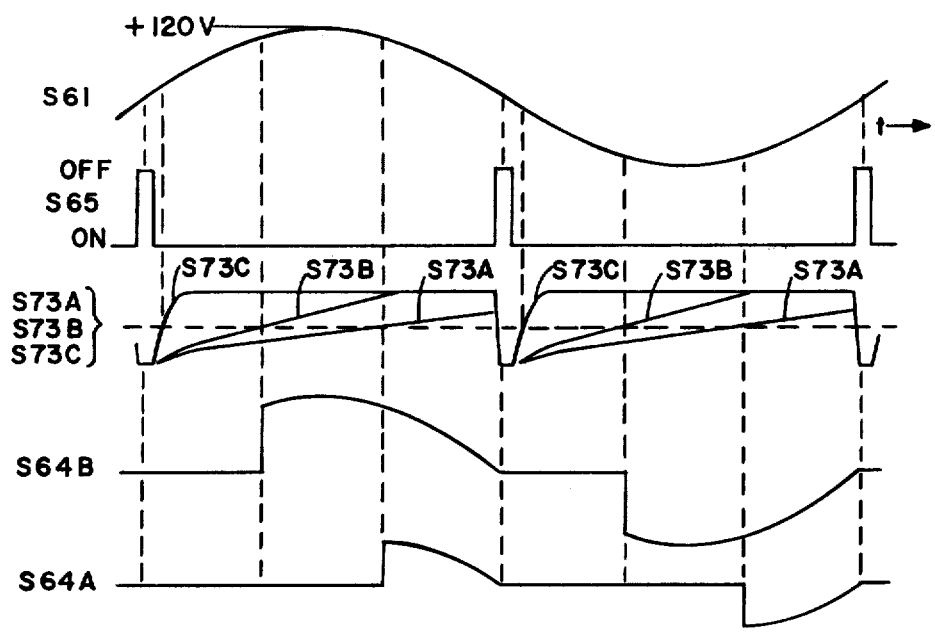
FIG. 5 is a timing diagram illustrating the operation of another portion of the circuit of FIG. 3.

FIG. 5 contains waveforms which are useful in further explaining the operation of circuit 60. Signal S61 for example, represents the 120 volt power signal which is received by receptacle 11. This signal is sent to the base of a transistor 65 through a pair of resistors 66 and 67. Transistor 65 responds to signal S61 as illustrated in FIG. 5 by a waveform S65. Specifically, transistor 65 is in an "off" condition when signal S61 is at approximately zero volts; and is in an "on" condition for the remaining portion of the signal. In other words, transistor 65 operates to detect the zero axis crossing of waveform S61. Transistor 65 turns on when the voltage at its base is two $V_{BE}$ voltage drops above the voltage on lead 61b. One of these drops occurs across transistor 65; while the other drop occurs across a diode 68.

When the voltage on lead 61b is more positive than the voltage on lead 61a, then a diode 69 enables transistor 65 to conduct. Also, a resistor 70 is provided to allow the current conducted by transistor 65 to flow to lead 61a. The amount of current which flows through transistor 65 is determined by a ten volt source and a resistor 71 which serially connect to the collector of transistor 65.

A second transistor 72 is also provided in circuit 60. This transistor turns on when transistor 65 is off; and turns off when transistor 65 is on. The function of transistor 72 is to discharge a capacitor 73 at the zero axis crossing of waveform S61. This function is performed by connecting capacitor 73 in parallel with transistor 72. A diode 74 is also provided at the emitter of transistor 72. This diode raises the threshold voltage of transistor 72, thereby insuring that it turns off when transistor 65 is on.

Also in circuit 60, the previously described control signal 56 is fed to capacitor 73 through a resistor 75 and a diode 76. Signal 56 thus provides a means for charging capacitor 73. Similarly, the previously described control signal S57 is fed to capacitor 73 through a resistor 77 and a diode 78. Thus signal S57 provides another means for charging capacitor 73. Preferably, resistor 77 is substantially smaller than resistor 75. Thus, when signal S56 is high, capacitor 73 charges at a relatively slow rate; whereas when signal S57 is high, capacitor 73 charges at a relatively fast rate. Further, when signals S56 and S57 are both high, capacitor 71 charges at an even faster rate.

These various charging rates are illustrated in FIG. 5 by waveforms S73a, S73b, and S73c. The signal S73a represents the charging rate of capacitor 73 when only signal S56 is high; signal S73b represents the charging rate when only signal S57 is high; and signal S73c represents the charging rate when both signals S56 and S57 are high. Superimposed on waveforms S73a-73c is a dashed line which lies approximately midway between the fully discharged and fully charged levels. This dashed line represents a trigger level for the previously described TRIAC 64. This TRIAC is off when the voltage level of capacitor 73 is below the dashed line; and is on when the voltage on capacitor 73 is above the dashed line. With a charging rate corresponding to waveform S73a, approximately one third of the power received at receptacle 11 is passed to receptacle 12. This is illustrated in FIG. 5 by a waveform S64a. Similarly, a charging rate corresponding to signal S73b results in the passage of approximately two thirds of the power received from receptacle 11. This is illustrated in FIG. 5 by waveform S64b. Also, a charging rate corresponding to waveform S73c results in the passage of nearly all of the power received at receptacle 11.

To perform these functions, there is included in circuit 60 a transistor 79 and a pair of bias resistors 80 and 81. The resistors 80 and 81 operate to bias the base of transistor 79 at approximately 6 volts. Accordingly, when the voltage at the emitter of transistor 79 is approximately one $V_{BE}$ drop above the voltage of the base (or at approximately 6.6 volts) transistor 79 turns on. The collector of transistor 79 connects through a resistor 82 to the base of another transistor 83. Thus, when transistor 79 turns on, base current is provided for transistor 83. This current turns on transistor 83. In turn, the base voltage of transistor 79 is lowered, and thus, it turns on even harder. This results in a very low impedance from capacitor 73 to the gate of TRIAC 64. Thus, capacitor 73 provides a large current spike to the TRIAC. Accordingly, TRIAC 64 turns on and allows the previously described portions of power to pass from receptacle 11 to receptacle 12.

Figure 4:
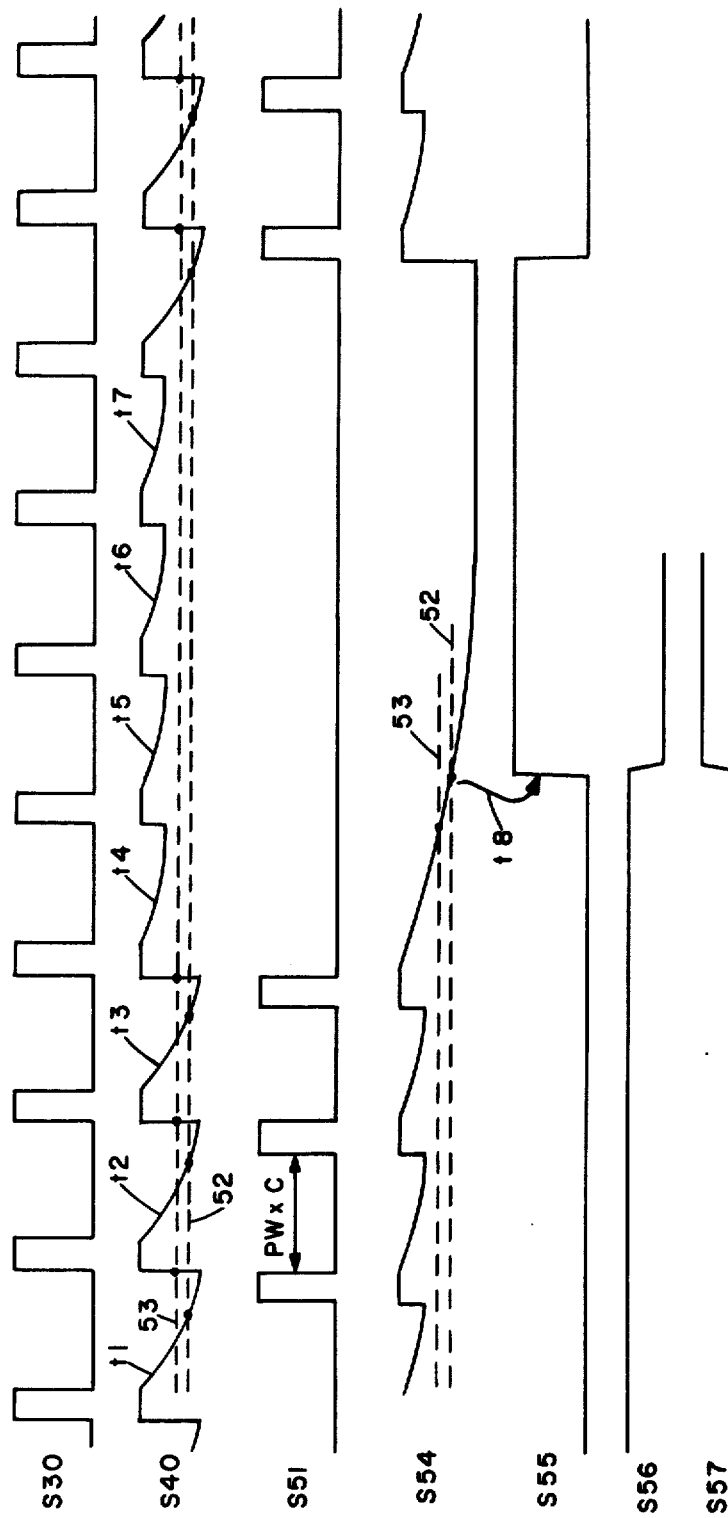
FIG. 4 is a timing diagram illustrating the operation of a portion of the circuitry of FIG. 3.
Figure 6:
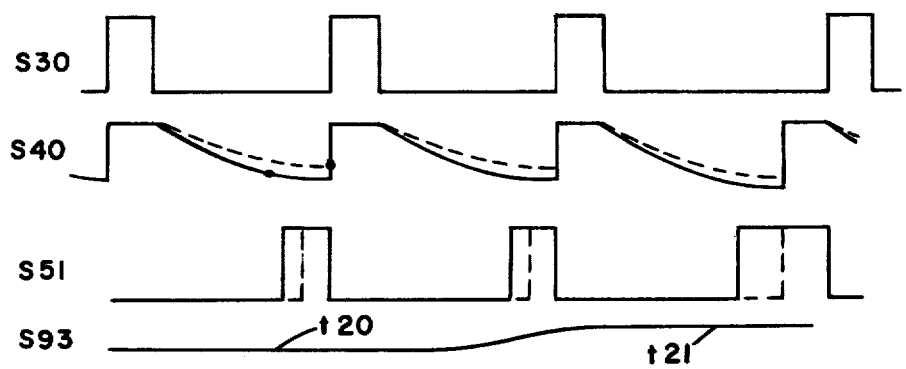
FIG. 6 is a timing diagram illustrating the operation of an auto-sensitivity circuit within the circuit of FIG. 3.

The disclosed invention also includes an auto sensitivity circuit which is indicated generally in FIG. 3 via reference numeral 90. Representative waveform that occur at various key points in circuit 90 are illustrated in FIG. 6. Also in that figure, waveforms S30, S40, and S51 again respectively represent the voltage output of oscillator 30, the voltage at node 40, and the voltage output of inverter 51.

In FIG. 6, waveform S40 includes both a solid line and a dashed line. The solid represents the voltage at node 40 under nominal light capacitive loading conditions; whereas the dashed line represents the voltage at node 40 when the capacitance of that node is increased slightly above the nominal value. Such an increase may be caused for example, when the lamp with which the disclosed device is operating is placed near to a large bodied object such as a plant. It will also be caused by the lamp itself if a large portion of the lamps exterior surface is conductive. Such objects and conductive surfaces will be capacitively coupled to node 40 through the previously described lamp socket 13 and the metal contacts 17. And due to this coupling, the voltage at node 40 will discharge slower than the nominal rate. This is indicated by the dashed lines of signal S40 in FIG. 6.

A lower discharge rate of node 40 produces pulses at the output of circuit 51 which are narrower in width than those pulses which are nominally produced at that point. Again in FIG. 6, signal S51 is represented by a solid line which indicates the nominal pulses that are produced at the output of circuit 51; and by a dashed line which represents the pulses which are produced at the output of circuit 51 under slightly increased capacitive loading at node 40. It is apparent from this Figure, that if the pulses at S51 become too narrow, then the resistor capacitor circuit 54 will not get fully charged; and signal S54 could fall below the threshold value of inverter 55. It is the function of auto sensitivity circuit 90 to sense that the pulsewidth of signals S51 are smaller than nominal and to take corrective action in response thereto.

To this end, circuit 90 includes a transistor 91. The base of this transistor is coupled to receive signal S51 through a resistor diode network 92. Thus, transistor 91 turns on in response to the positive pulses which comprise signal S51. A capacitor 93 connects in parallel to the collector base of transistor 91; and a ten volt source couples through a resistor 94 to charge this capacitor. Thus, in operation, capacitor 93 charges when transistor 91 is off, and discharges when transistor 91 is on. Therefore, the average value of the voltage across capacitor 93 is inversely proportional to the width of the pulses comprising signal S51. In FIG. 6, the signal S93 represents the average value of the voltage across capacitor 93. This signal illustrated at time instant T20 as being relatively low, and at time instant T21 as being relatively high. The value at time instant T20 corresponds to the voltage produced under nominal capacitive loading conditions, whereas the value at time in T21 corresponds the voltage produced under slightly increased capacitive loading conditions.

Signal S93 is coupled through a resistor 95 to the input of inverter 31. The effect of this coupling is to vary the frequency and duty cycle of signal S30 such that pulse width of signal S51 remains essentially constant over a wide range of steady capacitive loading for node 40. When this capacitive loading is relatively high, the higher voltage of signal S93 causes the frequency of signal S40 to decrease. This in turn gives node 40 more time to discharge. FIG. 6 indicates this via the waveforms above time instant T21. Due to this compensating effect, the width of the pulses comprising signal S51 are returned back to their nominal value, which was the intended result.

Figure 7:
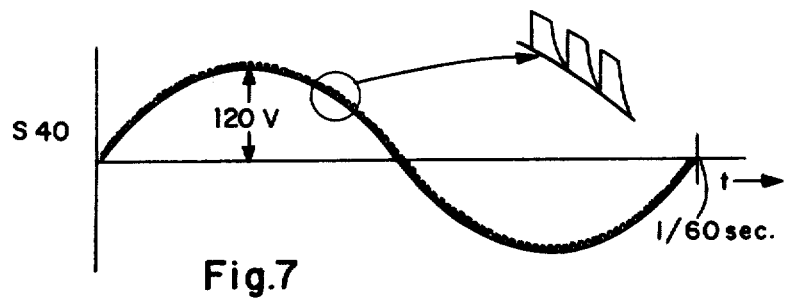
FIG. 7 is a timing diagram illustrating the operation of still another portion of the FIG. 3 circuit.

Another aspect of the invention is that it operates regardless which of the leads 61 or 62 in receptable 11 is carrying 120 volts. This has practical significance, because either lead 61 or lead 62 may be the "hot" lead depending upon how plug 15 of the lamp is inserted into the wall socket. This aspect of the invention will best be understood by referring now to the contact circuitry 100 in FIG. 3. This circuitry includes a resistor 101, a capacitor 102, and a resistor 103 which coupled lead 61b to node 40. Also a capacitor 104 couples contact 17 to resistor 101. Capacitors 102 and 104 act as high pass filters which will not pass the 60 cycle power signals on lead 61 and 62. Conversely, capacitors 102 and 104 also act as an AC short to signal S40, which is rapidly changing in comparison to the 60 cycle power input. Preferably, signal S40 has a repetition rate of several hundred $KHZ_A$; and capacitors 102 and 104 are approximately 100 picofarads. FIG. 7 illustrates signal S40 when lead 61b is the "hot" lead.

The only portion of the FIG. 3 circuit which now remains to be described is the ten volt power supply. Thus, power supply is indicated generally via reference numeral 110 and is conventional in form. The circuit includes a diode 111, a resistor 112, and a capacitor 113. These components operate to half wave rectify the 120 volt power signal received from receptacle 11. Circuit 110 further includes a resistor 114, a zenor diode 115, and a capacitor 116. Diode 115 has a reverse breakdown voltage of approximately 10 volts; and thus a DC voltage of that value is established across capacitor 116.

Figure 8:
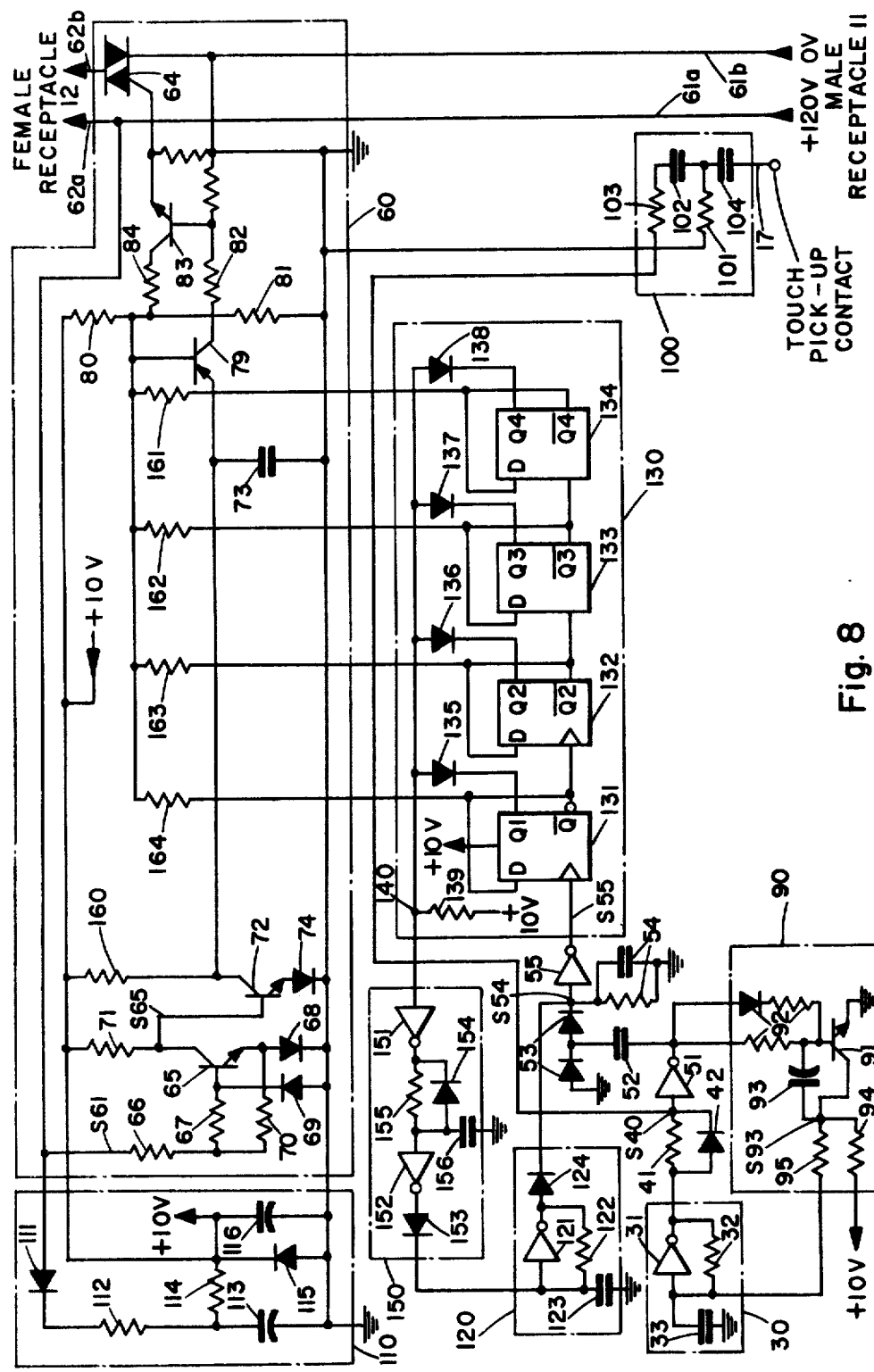
FIG. 8 is a detailed circuit diagram of a second embodiment of the invention.

Referring now to FIG. 8, a second embodiment of the invention will be described. Substantial portions of this embodiment are identical to the previously described embodiment of FIG. 3; and these portions are identified by like reference numerals. The major difference between the first and second embodiment is that the latter operates with any standard lamp as a dimmer controller. That is, as an exterior conductive portion of the lamp is being touched, the circuit of FIG. 8 operates to increase the amount of power which passes from receptacle 11 to receptacle 12 in small increments at some predetermined rate. In the illustrated embodiment, the transition from zero power to full power is divided into 16 increments; and the entire transition is made in approximately 3 seconds. The ramping sequence from zero power to full power automatically stops when full power is reached. In order to turn the lamp off, a subsequent touching of the lamp is required.

To implement these functions, there is included in the FIG. 8 embodiment, an oscillator that is shown generally at 120. Oscillator 120 includes an inverter 121 with hysteresis, a resistor 122, and a capacitor 123. Preferably, resistor 122 is approximately one megohm, and capacitor 123 is approximately 0.1 micro farad. This produces pulses at a rate of approximately 5 pulses per second at the output of inverter 121.

The output of inverter 121 is coupled via a diode 124 to the input of the previously described inverter gate 55. Due to this connection, the voltage at the input of inverter 55 will oscillate in accordance with the pulses produced by oscillator 120 whenever signal S51 is not pulsating. Conversely, the voltage at the input of inverter 55 is held at a high level whenever signal S51 is pulsating. Signal S51 pulsates of course, when no hand is touching the lamp, as was previously described.

The output of inverter 55 couples to a four stage counter 130. This counter includes triggerable flip-flops 131, 132, 133, and 134. Each of these flip-flops is a D-type flip-flop having there $\overline{Q}$ output connected to their D input. Also, the Q output of each flip-flop connects to the clocking input of the succeeding flip-flop. Accordingly, flip-flops 131-134 comprise a four stage count-up counter having 16 logic states. Thus, 16 pulses are required to occur at the input of inverter 55 in order for counter 130 to cycle through all of its states.

Counter 130 also includes four diodes 135, 136, 137, and 138 and a resistor 139. These components are interconnected as illustrated to respective Q outputs of flip-flops 131-134. Due to these interconnections, a high voltage level will be generated at a node 140 of resistor 139 only when all of the flip-flops 131-134 are set. That logical state of counter 130 corresponds to full power being passed from receptacle 11 to receptacle 12. Accordingly, a high logic signal on node 140 indicates that oscillator 120 should be disabled.

To perform this disabling function, there is included a feedback circuit 150 which couples counter 130 to oscillator 120. Feedback circuit 150 includes a pair of inverters 151 and 152, a pair of diodes 153 and 154, a resistor 155, and a capacitor 156. These components are interconnected as illustrated. In operation, a high voltage at node 140 produces a high voltage at the output of diode 153. This high voltage clamps the input of the inverter 121 to a high level which prevents oscillator 120 from oscillating. Conversely, a low level at node 140 produces a low level at the output of diode 153. And this low level enables oscillator 120 to oscillate, Thus, due to feedback circuit 150, counter 130 counts up until flip-flops 131-134 are all set; and then it stops counting. Thereby removing ones hand from the lamp and by subsequently retouching the lamp, counter 130 is reset and the lamp turns off.

In order for the 16 logic states of counter 130 to control the amount of power which passes from receptacle 11 to receptacle 12, there is included in the FIG. 8 circuit, resistors 160-164. The function of resistor 160 is to charge capacitor 73 at a predetermined rate. Conversely, the function of resistors 161-164 is to bias transistor 79 at a level which is representative of the logic state of counter 130. Preferably, this is accomplished by choosing values for resistor 161-164 such that they are approximately binary multiples of each other. Suitably, resistors 161-164 may respectively be 10 K ohms, 22 K ohms, 47 K ohms, and 100 K ohms.

When most of the flip-flops 131-134 are reset, the base of transistor 79 is biased to a relatively high level. Therefore, the voltage on capacitor 73 must ramp up to a relatively high level in order to turn transistor 79 on and allow power to pass from receptacle 11 to receptacle 12. Conversely, when most of the flip-flops 131-134 are set, the base of transistor 79 is biased to a relatively low voltage level. In this state, the voltage across capacitor 73 needs only to ramp up to a relatively low level in order to turn on transistor 79 and allow power to pass between receptacles 11 and 12. The 16 states of counter 130 biases the base of transistor 79 to 16 different voltage levels. And a different amount of power will pass between receptacle 11 and 12 in accordance with each of these bias voltages. Further, the difference in the amount of power which is transferred from one state to the next is only approximately one sixteenth of the total power that is received at receptacle 11. This amount of power is so small that by observing the brightness of the lamp as counter 130 steps from one state to the next, it appears to the human eye that light intensity is increasing continuously, rather than in discreet steps.

Various embodiments of the invention have now been described in detail. Further, several changes and modifications can be made to these preferred embodiments without departing from the nature and spirit of the invention. For example, counter 130 could be replaced with other sequential logic circuits having a predetermined number of logic states for stepping from one state to the next in response to clocking signals received from oscillator 120. The logic states of this sequential logic circuit would then be utilized to pass different positions of the power received from receptacle 11 to receptacle 12. Therefore,since various changes and modifications can be made to the above described preferred embodiments without departing from the nature and spirit of the invention, it is to be understood that the invention is not limited to said details but is defined in the appended claims:

We claim:

1. A control module adapter, to be used with any standard electric lamp having a metallic exterior portion, for turning said lamp on or off in response to a mere touching of said portion and for controlling by touch the brightness of light emitted from said lamp when it is turned on, said module comprising;
   a male electrical receptacle means of the screw-in type for screwing said module into the light bulb socket on said lamp:
   electronic mounting means fixedly connected to said male electrical receptacle means having an electronic circuit mounted thereon; said circuit including
   a capacitive means,
   coupling means for mechanically and electrically coupling said capacitive means to said metallic portion whenever said module is screwed into said light bulb socket;

means for charging said capacitive means at spaced apart intervals;

means for discharging said capacitive means at a first rate when no person is touching said metallic portion, and at a second rate when a person is touching said metal portion;

control means for detecting said first and second discharge rates and for generating logic control signals indicating said rates;

a female electrical receptacle means of the screw-in type for receiving a light bulb, and means for switching predetermined portions of power received from said male electrical receptacle means to said female electrical means in response to said control signals.

2. A module according to claim 1 and further including automatic sensitivity control means for detecting discharge rates lying between said first and second rates over several consecutive ones of said spaced apart intervals, and wherein said means for charging is responsive thereto for increasing the spacing between said intervals.

3. A module according to claim 1 wherein said means for coupling includes a filter serially connected between said capacitive means and said metallic portion for rejecting 60 cycle signals while simultaneously passing charging signals produced by said means for charging.

4. A module according to claim 1 wherein said means for coupling includes a pair of springy metallic strips extending from the sides of said module for making contact with the light bulb socket of said lamp when said module is screwed into said socket.

5. A module according to claim 1 wherein said control means includes sequential logic means having a predetermined number of logic states for stepping from one state to the next at a predetermined frequency whenever said second discharge rate is detected and wherein said means for switching passes different portions of said power at each of said states.

6. A module according to claim 5 wherein said control means further includes means for detecting a particular one of said states, and for inhibiting said stepping at said predetermined frequency when said one state is detected.

7. A module according to claim 6 wherein said sequential logic means is a sixteen state counter.

8. A module according to claim 1 wherein said control means includes sequential logic means having a predetermined number of logic states for stepping from one state to the next each time a transition from said first rate to second rate occurs, and wherein said means for switching passes different portions of said power at each of said states.

9. A module according to claim 8 wherein said sequential logic means is a four state counter.

* * * * *